(12) United States Patent
Wright

(10) Patent No.: US 7,123,033 B1
(45) Date of Patent: *Oct. 17, 2006

(54) METHOD AND AN APPARATUS TO DETECT LOW VOLTAGE

(75) Inventor: David G. Wright, Escondido, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/945,709

(22) Filed: Sep. 20, 2004

(51) Int. Cl.
*G01R 27/08* (2006.01)
*H02J 7/00* (2006.01)

(52) U.S. Cl. ............ 324/713; 320/124; 320/127

(58) Field of Classification Search ............ 324/713; 320/127, 124
See application file for complete search history.

(56) References Cited

U.S. PATENT DOCUMENTS

| | | | | |
|---|---|---|---|---|
| 4,843,592 A | * | 6/1989 | Tsuaki et al. | 714/22 |
| 4,879,505 A | * | 11/1989 | Barrow et al. | 323/312 |
| 4,951,171 A | * | 8/1990 | Tran et al. | 361/90 |
| 5,386,575 A | * | 1/1995 | Shinkai et al. | 713/340 |
| 5,717,256 A | * | 2/1998 | Okumura et al. | 307/66 |
| 6,091,227 A | * | 7/2000 | Beard | 320/132 |
| 6,348,798 B1 | * | 2/2002 | Daw | 324/426 |
| 6,885,952 B1 | * | 4/2005 | Hayes | 702/64 |
| 6,891,355 B1 | * | 5/2005 | Kernahan | 323/282 |
| 2005/0027776 A1 | * | 2/2005 | Lou | 708/650 |

* cited by examiner

*Primary Examiner*—Anjan Deb
*Assistant Examiner*—Jeff Natalini
(74) *Attorney, Agent, or Firm*—Blakely Sokoloff Taylor & Zafman LLP

(57) ABSTRACT

A method and an apparatus to detect low voltage have been disclosed. One embodiment of the apparatus includes a main circuit powered at a supply voltage, wherein the supply voltage changes over time and a test circuit coupled to the main circuit, the test circuit being representative of a voltage sensitivity of the main circuit to dynamically determine if the supply voltage is above a minimum voltage at which the main circuit operates correctly, wherein the minimum voltage changes over at least one of a temperature and a time and between different instances of the main circuit.

23 Claims, 10 Drawing Sheets

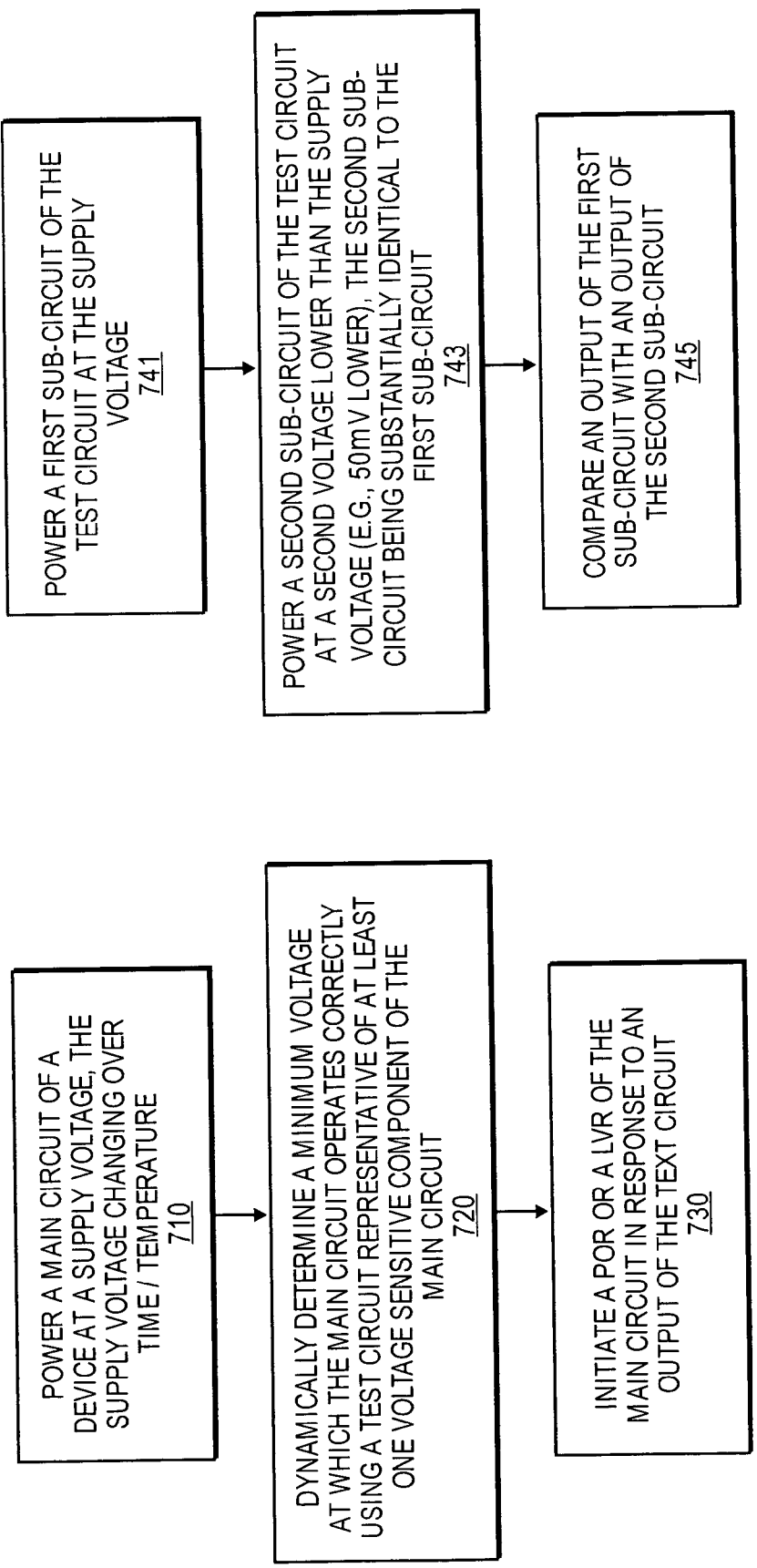

METHOD AND AN APPARATUS TO DETECT LOW VOLTAGE

FIELD OF INVENTION

The present invention relates generally to integrated circuits (IC), and more particularly, to detecting low voltage in the IC.

BACKGROUND

Batteries typically have a relatively large output voltage range, with the output voltage falling during the life of the battery. FIG. 1A illustrates the output voltage variation of a single typical alkaline battery cell over its life.

Unlike the batteries, ICs typically do not have operating voltage ranges that match the output voltage range of batteries. A common operating voltage range of an IC may be from about 2.4V to about 3.6V. Such an IC may be powered from a pair of alkaline batteries having a combined output voltage in the range approximately of 1.8V to 3.6V. Thus, there is a mismatch between the voltage ranges of the IC and the batteries.

One conventional technique to overcome this voltage range mismatch is to include a Direct Current (DC) to DC boost converter and a voltage detector in the IC. If the battery voltage is greater than the minimum voltage specified for the IC, then the boost converter is disabled and the IC is powered directly from the batteries. If the battery voltage falls below the specified minimum voltage, then the boost converter is enabled and the IC is powered from the boost converter instead. In many cases, the boost converter automatically supplies the battery voltage directly to the IC when the battery voltage is greater than the programmed output voltage. The boost converter and the IC powered by the boost converter may or may not be separate devices.

FIG. 1B illustrates an existing boost converter. Referring to FIG. 1B, the reference voltage 110 is substantially fixed to control voltage regulation. Specifically, when the output voltage of the boost converter 100 falls below the specified output voltage, a switching circuit 120 is activated to cause the output voltage 130 to rise above the specified output voltage.

However, the given minimum operating voltage, also referred to as the guaranteed minimum operating voltage Vcc(min), may not be the actual minimum voltage at which the IC can operate correctly under certain circumstances. Many ICs typically operate correctly somewhat below Vcc (min) in practice. In order to guarantee operation at the specified Vcc(min), IC manufacturers typically test the operation of the IC both slightly above the maximum rated temperature, and slightly below the minimum rated temperature at a voltage somewhat below Vcc(min). The voltage at which the IC ceases to operate correctly is generally below Vcc(min). In many cases, such a voltage may be well below Vcc(min) if the device is operated at room temperature.

In a sample case, an IC may be rated with Vcc(min) being approximately 2.7V and Vcc(max) being approximately 3.6V, with an operating temperature range of 0 to 70 degrees Celsius. The IC manufacturer may test every IC at about 2.6V at both −10 and +80 degrees Celsius. In this example, the IC may work correctly in all respects down to about 2.5V, and with degraded performance down to about 2.3V, provided that the temperature of operation is constrained to a smaller range than that specified (e.g., 0 to 70 degrees Celsius), such as 10 to 40 degrees Celsius.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

FIG. 7A shows one embodiment of a process to detect low voltage.

FIG. 7B shows one embodiment of a process to detect low voltage.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly couple and to indirectly couple through one or more intervening components.

Figure 1A:
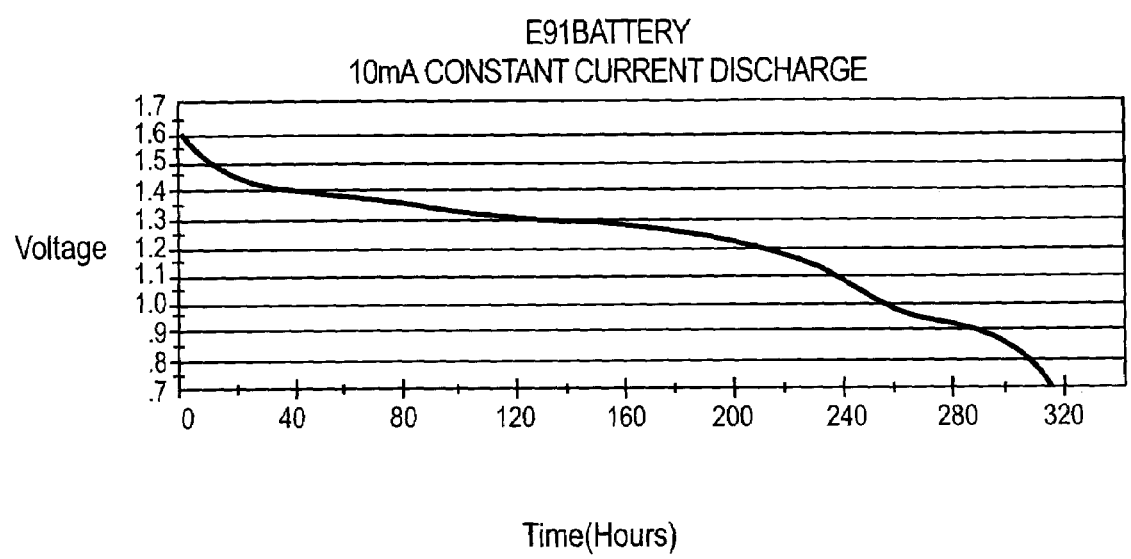
FIG. 1A shows the output voltage variation of a typical alkaline battery cell over its lifetime.
Figure 1B:
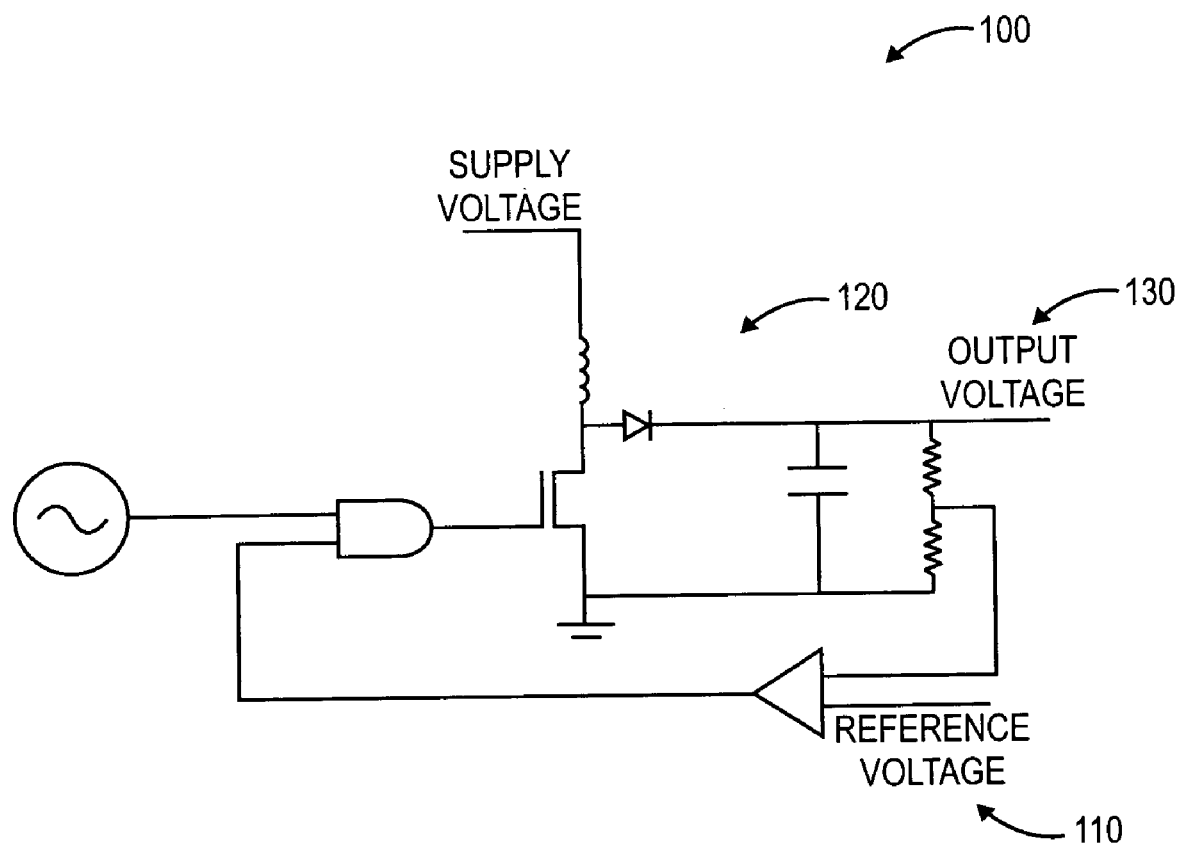
FIG. 1B shows an existing boost converter.
Figure 2:
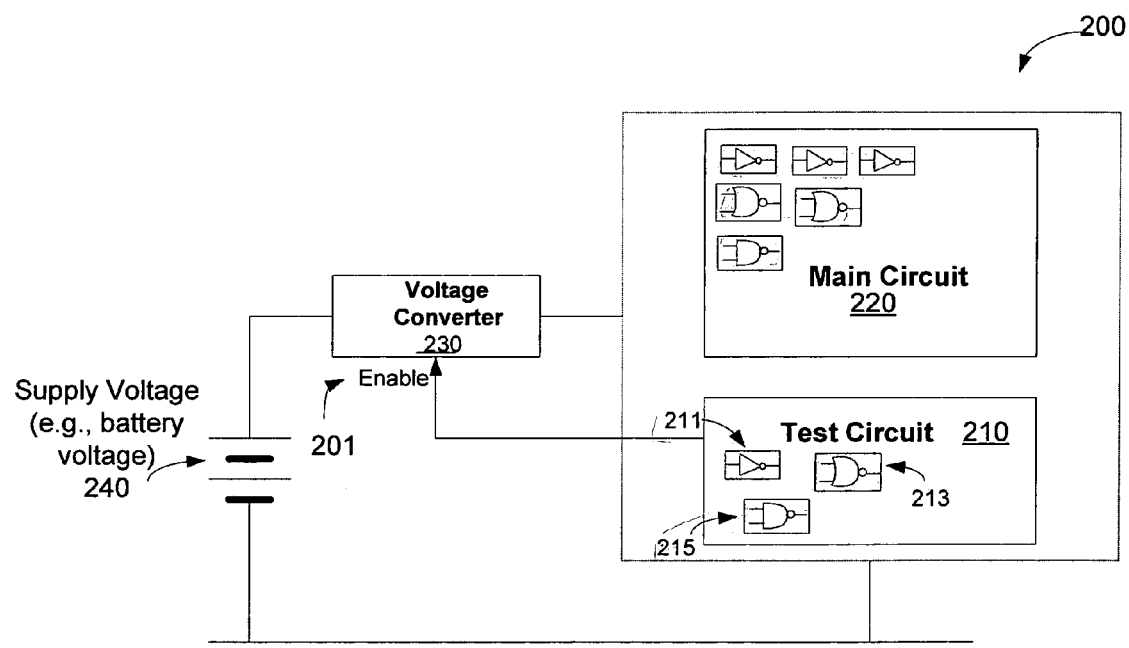
FIG. 2 shows one embodiment of a system to detect low voltage.

FIG. 2 shows one embodiment of a system for detecting low voltage in an IC. The system 200 includes a test circuit 210, a main circuit 220, a voltage converter 230, and a power source 240. The power source 240 may include at least one battery, such as an alkaline battery. Since the battery voltage changes over time and/or temperature, the supply voltage level from the power source 240 may also change over time and/or temperature. The test circuit 210 is representative of at least one voltage sensitive component of the main circuit 220. A voltage is supplied to the main circuit 220 and the test circuit 210 from the voltage converter 230. The voltage converter converts the voltage from the power source 240 when the voltage converter 230 is enabled. The voltage converter 230 does not convert the voltage from the power source 240 when the voltage converter 230 is disabled, in which case, the main circuit 220 and the test circuit 210 are powered at the voltage from the power source 240. The voltage converter 230 may include a boost converter to boost the voltage from the power source 240 or a buck converter to reduce the voltage from the power source 240.

In one embodiment, the test circuit 210 dynamically determines if the voltage supplied to the main circuit 220 is above the actual minimum voltage at which the main circuit operates correctly. Note that this actual minimum voltage may change over at least one of a temperature or a time. Based on the actual minimum voltage determined, the test circuit 210 outputs a signal, Enable 201 to the voltage converter 230. In response to Enable 201, the voltage converter 230 may be activated or enabled to boost the voltage supply from the power source 240 if the voltage supply falls to about the actual minimum voltage determined. Then the main circuit 220 is powered with the boosted voltage.

There are many manufacturing process factors that may cause one instance of a semiconductor device to have slightly different performance characteristics from another instance of that semiconductor device. One example is the doping level of the n or p material of the silicon. Such process factors typically vary significantly between silicon wafers, and slightly across a single silicon wafer, but not significantly across the silicon of a single IC. Therefore, in one embodiment, the test circuit 210 and the main circuit 220 reside on a common IC substrate such that the test circuit 210 can better represent the voltage sensitivity of the main circuit 220. As noted above, operating temperature also has a significant impact on the performance of an IC, and there may be variation in the coefficient of temperature effect on any given parameter between ICs.

Some of the impacts that these variations have on the operation of a typical Complementary Metal Oxide Semiconductor (CMOS) IC include the variation in the threshold voltage of the field effect transistors (FETs), Vt, the switching time of the transistors, and the maximum switching frequency of the transistors, Ft. Other effects may include variation in the voltage of a bandgap reference. Depending on the circuits implemented in the IC, some or all of these or other parametric variations may be the determinants of the actual minimum operating voltage of a specific IC at a specific point in time.

As the characteristics of all the devices across an IC may not be similar, it may therefore be useful to build the test circuit 210 representative of all types of devices in the IC. In one embodiment, the test circuit 210 includes at least one instance of every voltage-dependent standard cell type (e.g., a two-input NAND gate 215, a two-input NOR gate 213, an inverter 211, etc.) used in the main circuit 220. Furthermore, the test circuit 210 may include corner cases of the allowed layout design rules, such as clock skew between elements, etc. If the test circuit 210 is operated at a slightly lower voltage, clocked at a slightly higher frequency than the rest of the IC, or both, the test circuit 210 may provide an "early warning" that the supply voltage is nearing the actual minimum voltage at which the IC can operate correctly.

In one embodiment, the test circuit 210 runs substantially continuously to dynamically determine whether the supplied voltage from the power source 240 is above the minimum voltage for the main circuit 220 to operate correctly. Note that the minimum voltage determined may be lower than the guaranteed minimum voltage specified for the IC incorporating the main circuit 220. Thus, the lifetime of the power source 240 may be extended by allowing the power source 240 to keep on powering the main circuit 220 directly (without boosting the voltage) even when the voltage level of the power source 240 falls below the guaranteed minimum voltage of the IC.

Note that any or all of the components and the associated hardware illustrated in FIG. 2 may be used in various embodiments of the system 200. However, it should be appreciated that other configurations of the system 200 may include more or less devices than those shown in FIG. 2.

Figure 3:
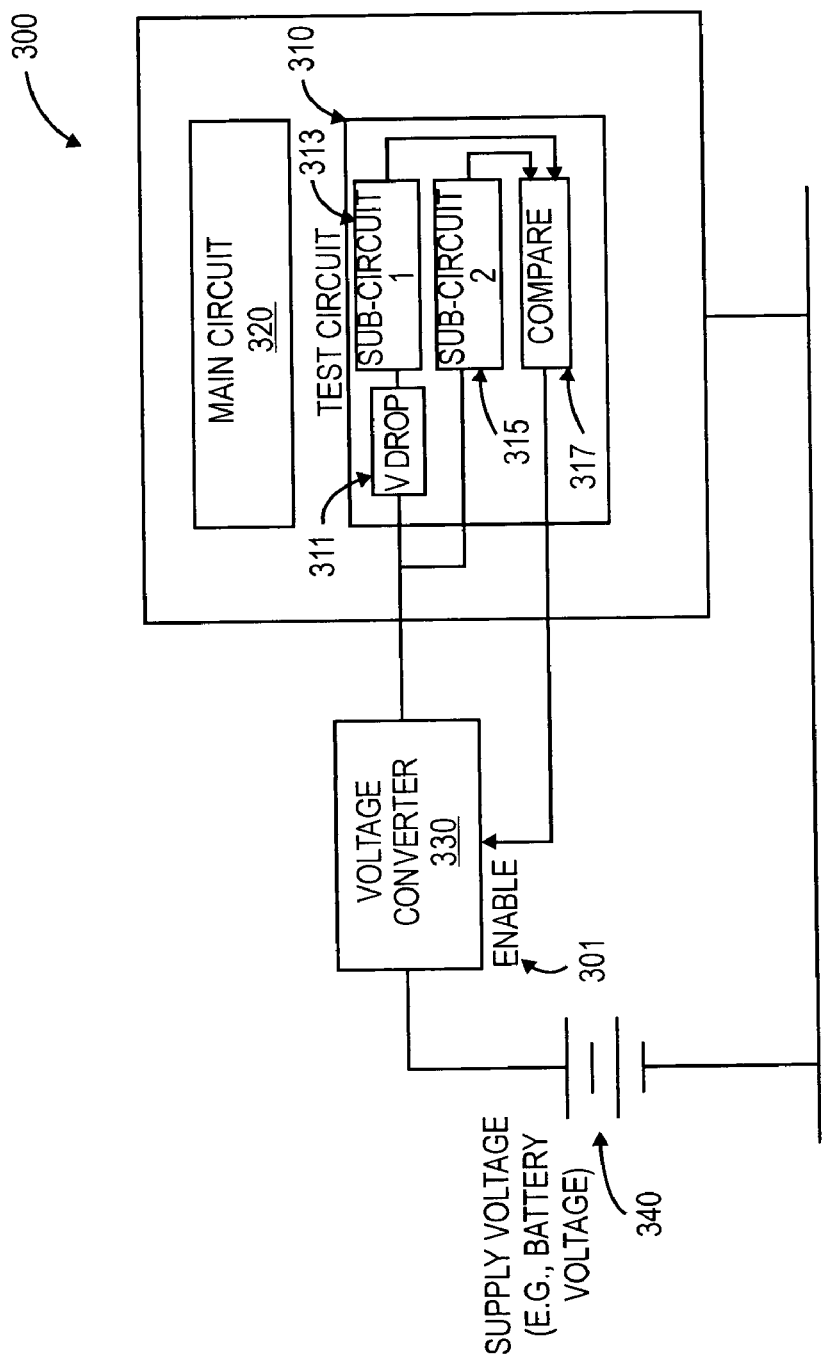
FIG. 3 shows one embodiment of a system to detect low voltage.

FIG. 3 illustrates one embodiment of a system for detecting low voltage in a semiconductor device. The system 300 includes a test circuit 310, a main circuit 320, a voltage converter 330, and a power source 340. The power source 340 may include at least one battery, such as an alkaline battery. The test circuit 310 further includes a voltage drop element 311, a first sub-circuit 313, a second sub-circuit 315, and a comparator 317.

In one embodiment, the first sub-circuit 313 is coupled to the output of the boost converter 330 via the voltage drop element 311. The second sub-circuit 315 may be coupled to the output of the boost converter 330 without going through the voltage drop element 311. The voltage drop element 311 reduces the output voltage of the boost converter by a predetermined amount, such as approximately 50 mV. As a result, the first sub-circuit 313 is powered at a voltage slightly lower than the output voltage of the boost converter 330 while the second sub-circuit 315 is powered at the output voltage of the boost converter 330. In one embodiment, the first and the second sub-circuits 313 and 315 are substantially identical and are representative of the voltage sensitivity of the main circuit 320.

Initially, the voltage converter 330 is not enabled to convert the voltage supply from the power source 340, and hence, the first sub-circuit 313 is powered at a voltage lower than the voltage supply from the power source 340 and the second sub-circuit 315 is powered at the voltage supply from the power source 340. When the voltage supply gets close to the actual minimum voltage at which the sub-circuits 313 and 315 can operate correctly, the output of the first sub-circuit 313 may differ from the output of the second sub-circuit 315 because the first sub-circuit 313 is powered at a lower voltage. The outputs of both sub-circuits 313 and 315 are input to the comparator 317 for comparison. When the outputs of the two sub-circuits 313 and 315 differ, one may infer that the supply voltage is getting close to the minimum voltage at which the main circuit 320 may operate correctly. Therefore, the comparator 317 may generate a signal, Enable 301 to cause the voltage converter 330 to start boosting the supply voltage from the power source 340.

In one embodiment, each of the sub-circuits 313 and 315 includes a linear feedback shift register (LFSR) that generates a pseudo random number sequence or code. The LFSRs may include circuitries representative of the voltage sensitivity of the main circuit 320. When both LFSRs operate correctly at their corresponding power supplies, they may generate the same sequence. However, when the LFSR that operates at a lower power supply starts to operate incorrectly due to the lower power supply, the pseudo random number sequence generated would be different from the pseudo random number sequence generated by the other LFSR. Therefore, by comparing the pseudo random number sequences generated by the two LFSRs, the comparator 317 is able to determine whether the supply voltage is getting close to the actual minimum voltage at which the LFSRs can operate correctly. Furthermore, one may infer that this actual minimum voltage is substantially the same as the actual minimum voltage at which the main circuit 320 can operate correctly because the LFSRs include circuitries representative of the voltage sensitivity of the main circuit 320. One advantage in using the LFSRs is that any single error may propagate indefinitely, and thus, a persistent error may trigger an error output signal.

Figure 4:
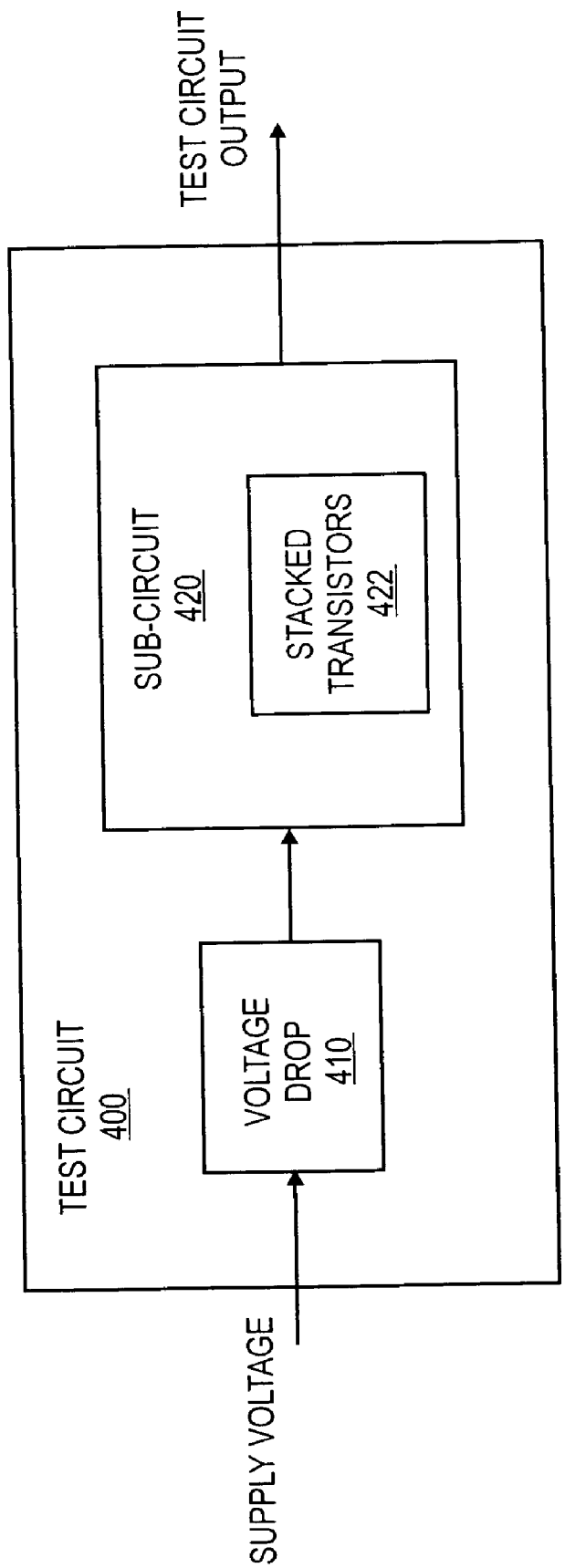
FIG. 4 shows one embodiment of a test circuit to detect low voltage.

FIG. 4 illustrates an alternative embodiment of a test circuit 400 to detect low voltage in an IC. The test circuit 400 includes a voltage drop element 410 and a sub-circuit 420. The sub-circuit 420 may include a number of stacked transistors 422. A supply voltage from a power source (e.g., the power source 240 in FIG. 2) is input to the voltage drop element 410, which lowers the supply voltage by a predetermined amount, such as approximately 50 mV. Then the lowered voltage is input to the sub-circuit 420 to power the sub-circuit 420.

In one embodiment, the sub-circuit 420 outputs a first output state when operating correctly and outputs a second output state when operating incorrectly. For example, the sub-circuit 420 may include a number of stacked transistors. All of the stacked transistors are turned on or activated to generate a first output state when the supply voltage minus the voltage drop is above the minimum voltage at which the sub-circuit 420 operates correctly. When the supply voltage minus the voltage drop falls below the minimum voltage, one or more of the stacked transistors are turned off or deactivated to generate a second output state different from the first output state. Therefore, when the output of the sub-circuit 420 changes from the first output state to the second output state, it can be inferred that the supply voltage is getting close to the minimum voltage at which the sub-circuit 420 operates correctly. Since the sub-circuit 420 is representative of the voltage sensitivity of a main circuit in the IC, the change in the output of the sub-circuit 420 may indicate that the supply voltage is getting close to the minimum voltage at which the main circuit can operate correctly.

Figure 5:
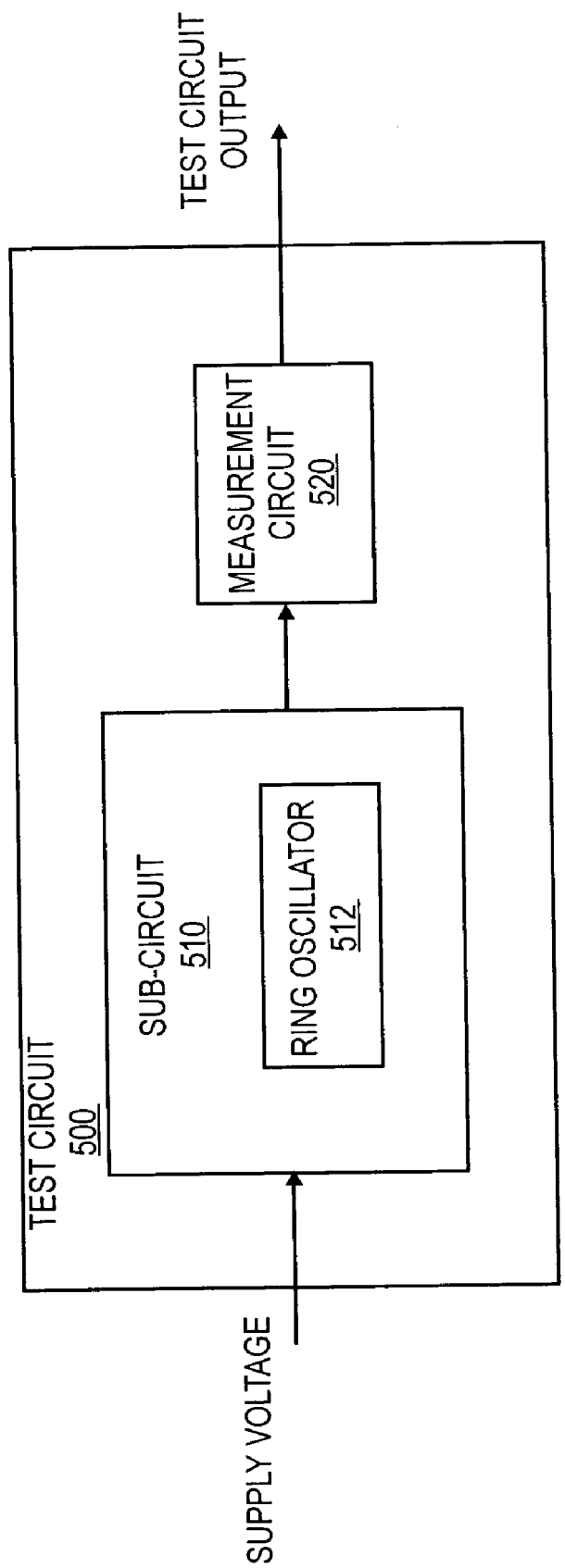
FIG. 5 shows an alternative embodiment of a test circuit to detect low voltage.

FIG. 5 illustrates an alternative embodiment of a test circuit. The test circuit 500 includes a sub-circuit 510 and a measurement circuit 520. The sub-circuit 510 may include a ring oscillator 512. The sub-circuit 510 may be representative of the voltage sensitivity of a main circuit of the semiconductor device incorporating the test circuit 500. The sub-circuit 510 is powered at a supply voltage substantially the same as the supply voltage that powers the main circuit. The supply voltage may be provided by a power source, such as the power source 240 in FIG. 2. The sub-circuit 510 is coupled to the measurement circuit 520. The measurement circuit 520 measures at least one parameter (e.g., frequency, etc.) of an output of the sub-circuit 510. As the supply voltage falls, the output of the sub-circuit 510 changes. When the parameter of the output of the sub-circuit 510 reaches a predetermined level, one may infer that the supply voltage is getting close to a minimum voltage at which the main circuit operates correctly because the sub-circuit 510 is representative of the voltage sensitivity of the main circuit.

In one embodiment, the sub-circuit 510 includes a ring oscillator 512. As the supply voltage falls, the frequency of the output of the ring oscillator 512 falls. The measurement circuit 520 may include a frequency measurement circuit to measure the frequency of the output of the ring oscillator 512. When the frequency of the output of the ring oscillator 512 reaches a predetermined value, the measurement circuit 520 may generate an output to trigger a boost converter (e.g., the boost converter 230 in FIG. 2) to boost the supply voltage.

Figure 6:
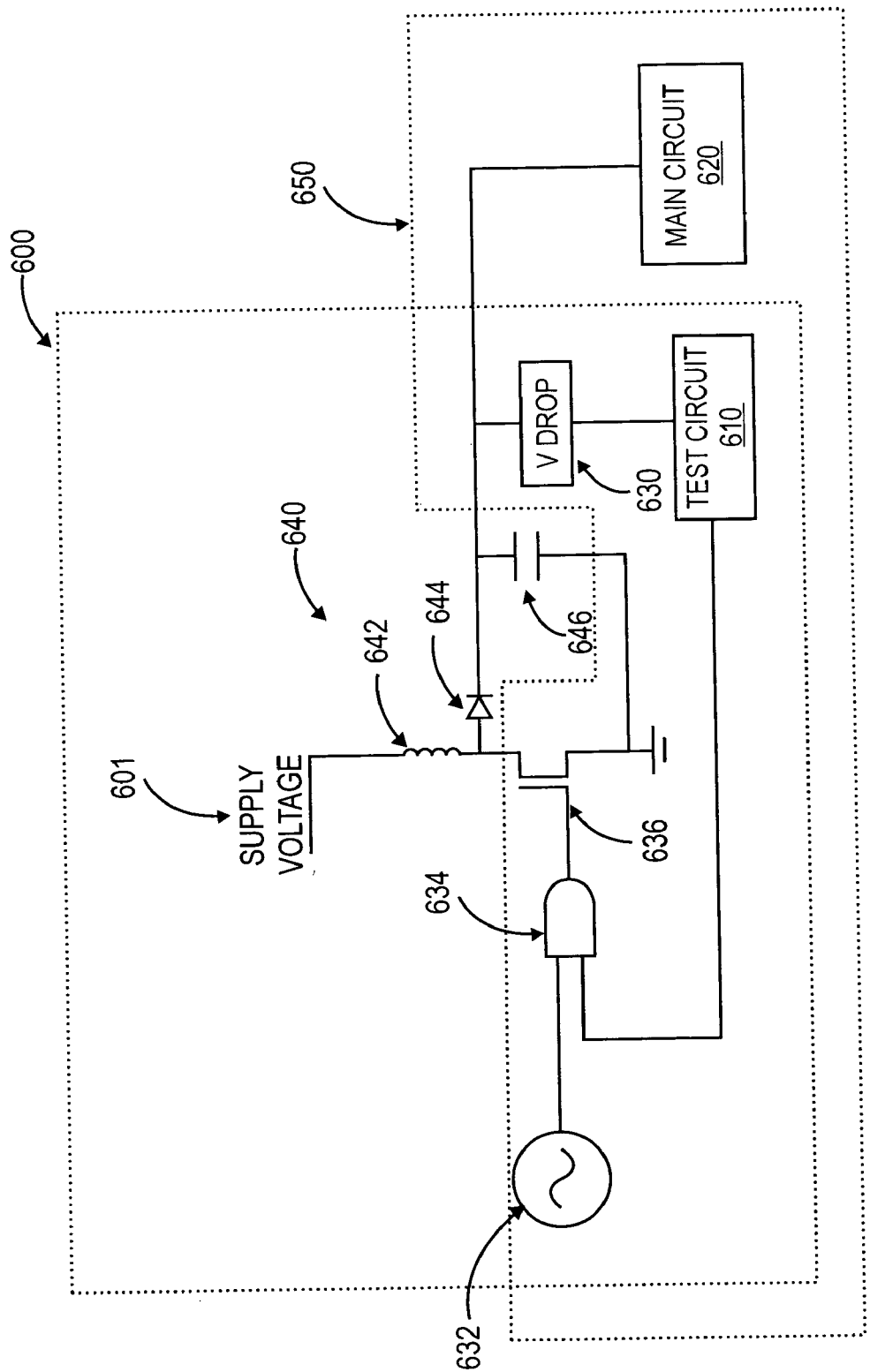
FIG. 6 shows one embodiment of a boost converter.

FIG. 6 shows one embodiment of a boost converter in a semiconductor device. The boost converter 600 includes a test circuit 610, a voltage drop element 630, and a switching circuit 640. The boost converter 600 is powered at a supply voltage 601. An output of the boost converter 600 is coupled to a main circuit 620 of the semiconductor device. The supply voltage 601 is provided by a power source, such as the power source 240 in FIG. 2. The voltage drop element 630 lowers the supply voltage 601 by a predetermined amount, such as approximately 50 mV, and provides the lowered supply voltage to power the test circuit 610. Some exemplary embodiments of the test circuit 610 have been described above with reference to FIGS. 3–5. In one embodiment, the test circuit 610, the main circuit 620, the voltage drop element 630, the signal source 632, the AND gate 634, and the transistor 646 reside on a common integrated circuit substrate 650. The inductor 642, the diode 644, and the capacitor 646 are external components located off the integrated circuit substrate 650. The test circuit dynamically determines if the supply voltage is above the actual minimum voltage at which the main circuit 620 can operate correctly. When the supply voltage 601 falls below the actual minimum voltage, the test circuit 610 may trigger the switch 640 to cause the boost converter 600 to generate a slightly higher voltage than the supply voltage 601. The slightly higher voltage may be used to power the main circuit 620. The voltage supplied to the main circuit 620 may therefore be slightly above (e.g., approximately 50 mV above) the actual minimum voltage required by the main circuit 620 for correct operation.

By determining if the supply voltage is above the actual minimum voltage at which the main circuit 620 can operate correctly, the semiconductor device is allowed to operate at voltages below the guaranteed minimum voltage specified for the semiconductor device. Note that the actual minimum voltage at which the main circuit 620 can operate correctly is typically lower than the guaranteed minimum voltage specified for the semiconductor device incorporating the main circuit 620. Allowing the semiconductor device to operate between the guaranteed minimum voltage and the actual minimum voltage extends the lifetime of the power source because one would have, otherwise, replaced the power source or boosted the supply voltage from the power source when the supply voltage from the power source substantially reaches the guaranteed minimum voltage.

FIG. 7A shows one embodiment of a process to detect low voltage in a semiconductor device. The process is performed by processing logic that may comprise hardware (e.g., circuitry, dedicated logic, etc.), software (such as is run on a general-purpose computer system, a server, or a dedicated machine), or a combination of both.

In one embodiment, the semiconductor device includes a main circuit and a test circuit representative of the voltage sensitivity of the main circuit. Referring to FIG. 7A, processing logic powers the main circuit of the semiconductor device at a supply voltage (processing block 710). The supply voltage may change over time and/or temperature. Processing logic dynamically determines the actual minimum voltage at which the main circuit operates correctly using the test circuit (processing block 720). Typically, the actual minimum voltage of the main circuit is lower than the guaranteed minimum voltage specified for the semiconductor device.

Processing logic may initiate a power on reset (POR) or a low voltage reset (LVR) of the main circuit in response to an output of the test circuit (processing block 730). Since processing logic has determined the actual minimum voltage of the main circuit and has triggered the reset just above the actual minimum voltage, the main circuit may come out of the reset just above the actual minimum voltage for each individual semiconductor device, rather than at the guaranteed minimum voltage of the semiconductor device across temperature and device-to-device variations. Likewise, once operating, the semiconductor device may continue to operate down to the actual minimum voltage, rather than to the guaranteed minimum voltage.

FIG. 7B illustrates one embodiment of a process to detect low voltage in a semiconductor device. The process is performed by processing logic that may comprise hardware (e.g., circuitry, dedicated logic, etc.), software (such as is run on a general-purpose computer system, a server, or a dedicated machine), or a combination of both.

In one embodiment, the semiconductor device includes a main circuit powered at a supply voltage. The semiconductor device may further include a test circuit representative of the voltage sensitivity of the main circuit. Referring to FIG. 7B, processing logic powers a first sub-circuit of the test circuit at the supply voltage (processing block 741). Processing logic powers a second sub-circuit of the test circuit at a second voltage lower than the supply voltage, where the second sub-circuit is substantially identical to the first sub-circuit (processing block 743). In some embodiments, the second voltage is approximately 50 mV lower than the supply voltage. Processing logic then compares an output of the first sub-circuit with an output of the second sub-circuit (processing block 745). If both sub-circuits are operating correctly, the outputs of the two sub-circuits are substantially the same. However, if the second sub-circuit starts to operate incorrectly due to the lower voltage supply, then the output of the second sub-circuit may become different from the output of the first sub-circuit. Therefore, processing logic may determine the actual minimum voltage at which the main circuit can operate correctly by comparing the outputs of the first and the second sub-circuits.

Figure 7D:
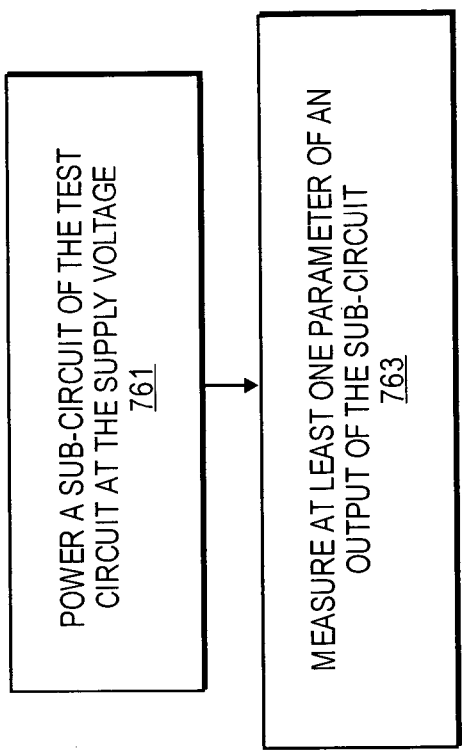
FIG. 7D shows an alternative embodiment of a process to detect low voltage.
Figure 7C:
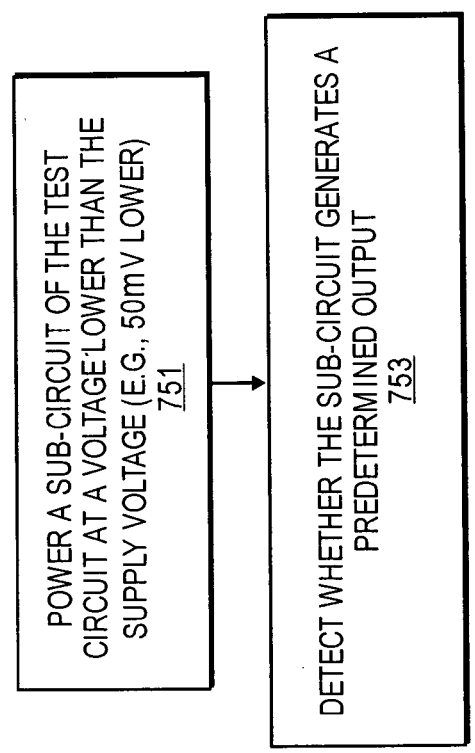
FIG. 7C shows an alternative embodiment of a process to detect low voltage.

FIG. 7C illustrates an alternative embodiment of a process to detect low voltage in a semiconductor device. The process is performed by processing logic that may comprise hardware (e.g., circuitry, dedicated logic, etc.), software (such as is run on a general-purpose computer system, a server, or a dedicated machine), or a combination of both.

In one embodiment, a main circuit of the semiconductor device is powered at a supply voltage. Referring to FIG. 7C, processing logic powers a sub-circuit of a test circuit in the semiconductor device at a voltage lower than the supply voltage (processing block 751). The test circuit is representative of the voltage sensitivity of the main circuit. Processing logic detects whether the sub-circuit generates a predetermined output (processing block 753). For example, the sub-circuit may include a number of stacked transistors. When the voltage powering the sub-circuit is above a predetermined value, all of the stacked transistors are turned on or activated. When the voltage falls below the predetermined value, one or more of the stacked transistors are turned off or deactivated. As a result, the output of the sub-circuit may change from one state to another state. By monitoring the state of the output of the sub-circuit, processing logic may determine the actual minimum voltage at which the main circuit can operate correctly.

FIG. 7D illustrates an alternative embodiment of a process to detect low voltage in a semiconductor device. The process is performed by processing logic that may comprise hardware (e.g., circuitry, dedicated logic, etc.), software (such as is run on a general-purpose computer system, a server, or a dedicated machine), or a combination of both.

In one embodiment, the semiconductor device includes a main circuit powered at a supply voltage. The semiconductor device may further include a test circuit representative of the voltage sensitivity of the main circuit. Referring to FIG. 7C, processing logic powers a sub-circuit of the test circuit at the supply voltage (processing block 761). Processing logic measures at least one parameter of an output of the sub-circuit (processing block 763). For example, the test circuit may include a ring oscillator to generate an output. The frequency of the ring oscillator output may change with the supply voltage. When the supply voltage is below the actual minimum voltage at which the main circuit operates correctly, the frequency of the ring oscillator output falls below a predetermined value. Therefore, by measuring the frequency of the ring oscillator output, processing logic may determine the actual minimum operating voltage of the main circuit.

Figure 8:
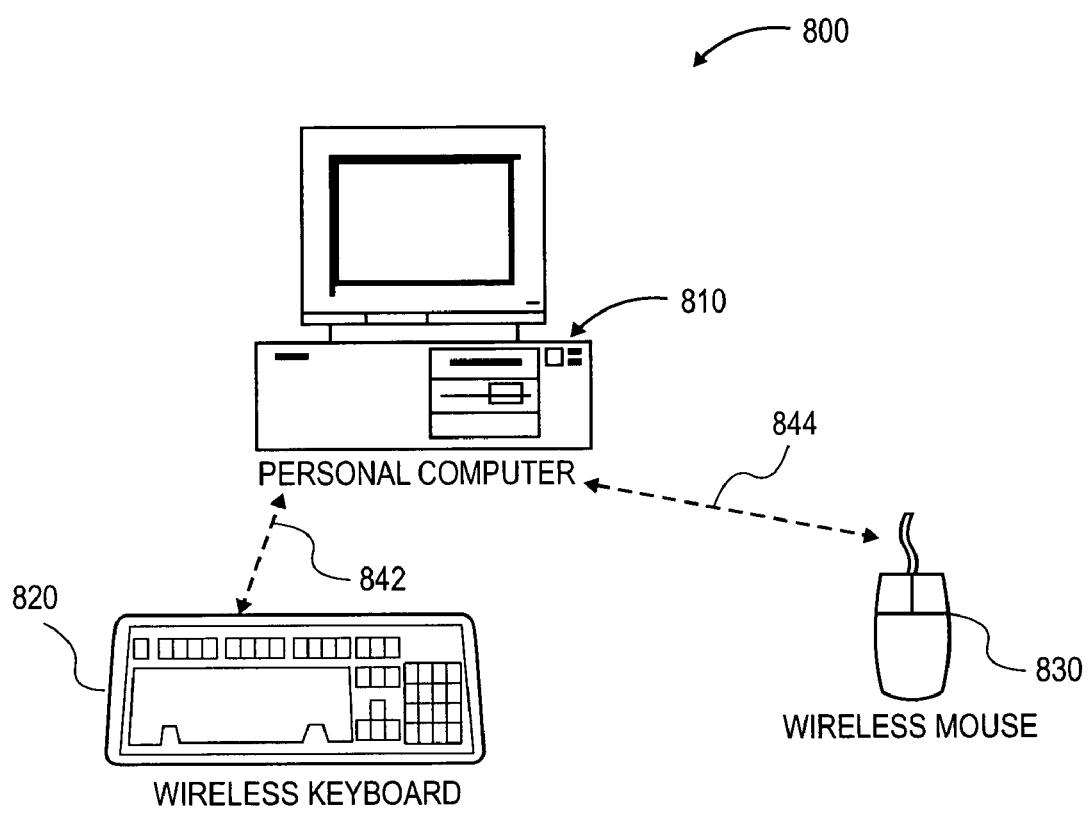
FIG. 8 shows an exemplary embodiment of a computer system usable with one embodiment of the present invention.

FIG. 8 illustrates an exemplary embodiment of a computer system 800 usable with one embodiment of the invention. The system 800 includes a personal computer 810, a wireless keyboard 820, and a wireless mouse 830. The wireless keyboard 820 is communicably coupled to the personal computer 810 via the wireless link 842. Likewise, the wireless mouse 830 is communicably coupled to the personal computer 810 via the wireless link 844. In some embodiments, the wireless keyboard 820 and the wireless mouse 830 are each powered by a power source having at least one battery, such as an alkaline battery. The voltage supply from the power source may change over time and/or temperature because the battery voltage may change over time and/or temperature.

In some embodiments, the wireless keyboard 820 includes a main circuit and a test circuit to dynamically determine the actual minimum voltage at which the main circuit operates correctly. The actual minimum voltage is typically less than the guaranteed minimum voltage specified for the wireless keyboard 820. By determining the actual minimum voltage, the main circuit may still be powered by the power source even when the voltage supply falls below the guaranteed minimum voltage. As a result, the power source may last longer before a boost converter of the wireless keyboard 820 is activated or a replacement of the power source is needed. Likewise, the wireless mouse 830 may include a similar test circuit to dynamically determine the actual minimum voltage at which a main circuit of the wireless mouse 830 operates correctly. Various embodiments of the test circuit have been described above with reference to FIGS. 3–5.

Note that any or all of the components of the computer system 800 and associated hardware may be used in various embodiments of the present invention. However, it can be appreciated that other configurations of the systems may include additional or fewer components than those illustrated in FIG. 8.

Although the computer system 800 is described above to illustrate one application of the technology disclosed, one should appreciate that the technology disclosed is applicable to other types of electronic systems that include a power source, whose voltage output may vary over time and/or temperature.

The foregoing discussion merely describes some exemplary embodiments of the present invention. One skilled in the art will readily recognize from such discussion, the accompanying drawings, and the claims that various modifications can be made without departing from the spirit and scope of the appended claims. The description is thus to be regarded as illustrative instead of limiting.

What is claimed is:

1. An apparatus, comprising:
  a main circuit powered at a supply voltage, wherein the supply voltage changes over time; and a test circuit coupled to the main circuit, the test circuit being representative of a voltage sensitivity of the main circuit without sharing any common component with the main circuit, the test circuit to dynamically determine if the supply voltage is above a minimum voltage at which the main circuit operates, wherein the minimum voltage changes over at least one of a temperature and a time and between different instances of the main circuit.

2. The apparatus of claim 1, wherein the test circuit comprises:
a first sub-circuit powered at the supply voltage;
a second sub-circuit powered at a second voltage lower than the supply voltage, the second sub-circuit being substantially identical to the first sub-circuit; and
a circuit coupled to the first and the second sub-circuits to compare an output of the first sub-circuit with an output of the second sub-circuit.

3. The apparatus of claim 1, wherein the main circuit comprises a plurality of different types of standard cells and the test circuit comprises at least one standard cell of each of the plurality of different types of standard cells.

4. The apparatus of claim 1, wherein the test circuit comprises:
a third sub-circuit powered at a third voltage lower than the supply voltage to generate a first output if the third sub-circuit operates correctly at the third voltage and to generate a second output if the third sub-circuit operates incorrectly at the third voltage; and
a detection circuit coupled to the third sub-circuit to determine whether the third sub-circuit generates the first output or the second output.

5. The apparatus of claim 4, wherein the third sub-circuit comprises a plurality of transistors stacked together.

6. The apparatus of claim 1, wherein the test circuit comprises:
a fourth sub-circuit powered at the supply voltage; and
a measurement circuit coupled to the fourth sub-circuit to measure at least one parameter of an output of the fourth sub-circuit.

7. The apparatus of claim 6, wherein the fourth sub-circuit comprises a ring oscillator comprising a plurality of inverters coupled to each other in a loop and the measurement circuit comprises a frequency measurement circuit to measure an output frequency of the ring oscillator.

8. The apparatus of claim 1, wherein the main circuit and the test circuit reside on a common integrated circuit substrate and input/output (I/O) ports of the main circuit and I/O ports of the test circuit are not directly coupled to each other.

9. The apparatus of claim 1, further comprising:
a voltage converter coupled between a voltage source, the test circuit, and the main circuit to convert a voltage from the voltage source and to power the main circuit at the converted voltage in response to an output of the test circuit.

10. The apparatus of claim 9, wherein the converted voltage is approximately 50 mV above the minimum voltage.

11. The apparatus of claim 1, further comprising:
a wireless peripheral device powered by at least one battery, the wireless peripheral device comprising the main circuit and the test circuit; and
a central processing unit communicably coupled to the wireless peripheral device.

12. The apparatus of claim 11, wherein the wireless peripheral device comprises a wireless keyboard.

13. An apparatus comprising:
a main circuit powered at a supply voltage, wherein the supply voltage changes over time; and
a test circuit coupled to the main circuit, the test circuit being representative of a voltage sensitivity of the main circuit to dynamically determine if the supply voltage is above a minimum voltage at which the main circuit operates correctly, wherein the minimum voltage changes over at least one of a temperature and a time and between different instances of the main circuit, and the test circuit comprises
a first sub-circuit powered at the supply voltage;
a second sub-circuit powered at a second voltage lower than the supply voltage, the second sub-circuit being substantially identical to the first sub-circuit; and
a circuit coupled to the first and the second sub-circuits to compare an output of the first sub-circuit with an output of the second sub-circuit, wherein each of the first and the second sub-circuits comprises a linear feedback shift register (LFSR) to generate a pseudo-random number sequence.

14. A method, comprising:
powering a main circuit of a device at a supply voltage, wherein the supply voltage changes over time; and
dynamically determining if the supply voltage is above a minimum voltage at which the main circuit operates using a test circuit, the test circuit being representative of a voltage sensitivity of the main circuit without sharing any common component with the main circuit, wherein the minimum voltage changes over at least one of a temperature and a time and between different instances of the main circuit.

15. The method of claim 14, wherein the main circuit and the test circuit reside on a common integrated circuit substrate.

16. The method of claim 15, wherein dynamically determining the minimum voltage comprises:
powering a first sub-circuit of the test circuit at the supply voltage to cause a first linear feedback shift register in the first sub-circuit to generate a first random number;
powering a second sub-circuit of the test circuit at a second voltage lower than the supply voltage to cause a second linear feedback shift register in the second sub-circuit to generate a second random number; and
comparing the first random number with the second random number.

17. The method of claim 15, wherein dynamically determining the minimum voltage comprises:
powering a third sub-circuit of the test circuit at a third voltage lower than the supply voltage; and
detecting whether the third sub-circuit generates a predetermined output.

18. The method of claim 15, wherein dynamically determining the minimum voltage comprises:
powering a fourth sub-circuit of the test circuit at the supply voltage; and
measuring at least one parameter of an output of the fourth sub-circuit.

19. The method of claim 15, further comprising:
initiating power-on reset (POR) of the main circuit in response to an output of the test circuit.

20. The method of claim 15, further comprising:
initiating low voltage reset (LVR) of the main circuit in response to an output of the test circuit.

21. An apparatus, comprising:
means for extending a life of at least one battery used to power a main circuit;

means for powering the main circuit directly with the at least one battery until a level of a supply voltage of the at least one battery substantially reaches a minimum voltage at which the main circuit operates; and means for dynamically determining the minimum voltage using a test circuit, the test circuit being representative of a voltage sensitivity of the main circuit without sharing any common component with the main circuit.

22. The apparatus of claim 21, wherein the main circuit and the test circuit reside on a common integrated circuit substrate.

23. The apparatus of claim 22, further comprising:

means for boosting the supply voltage from the at least one battery when the level of the supply voltage substantially reaches the minimum voltage.

* * * * *